US 6,734,095 B2
May 11, 2004

(12) United States Patent
Leuschner et al.

(54) METHOD FOR PRODUCING CAVITIES WITH SUBMICROMETER PATTERNS IN A SEMICONDUCTOR DEVICE USING A FREEZING PROCESS LIQUID

(75) Inventors: Rainer Leuschner, Mohegan Lake, NY (US); Egon Mergenthaler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/230,774

(22) Filed: Aug. 29, 2002

(65) Prior Publication Data

US 2003/0042612 A1 Mar. 6, 2003

(30) Foreign Application Priority Data

Aug. 29, 2001 (DE) .......................................... 101 42 201

(51) Int. Cl.[7] .......................................... H01L 21/4763
(52) U.S. Cl. ..................... 438/619; 438/624; 438/637; 438/759
(58) Field of Search ................................ 438/619, 624, 438/637, 759, FOR 355, FOR 438; 257/E23.144, E21.581

(56) References Cited

U.S. PATENT DOCUMENTS

| 5,059,502 | A | * | 10/1991 | Kojima et al. ............... 430/66 |
| 5,082,756 | A | * | 1/1992 | Doi ............................. 430/67 |
| 5,599,745 | A | | 2/1997 | Reinberg |
| 5,668,398 | A | | 9/1997 | Havemann et al. |
| 5,869,880 | A | | 2/1999 | Grill et al. |
| 6,165,890 | A | | 12/2000 | Kohl et al. |
| 6,211,561 | B1 | * | 4/2001 | Zhao ........................... 257/522 |
| 6,268,262 | B1 | * | 7/2001 | Loboda ....................... 438/422 |
| 6,340,601 | B1 | * | 1/2002 | Curran, Jr. et al. ............. 438/4 |

FOREIGN PATENT DOCUMENTS

| GB | 2 330 001 A | 4/1999 |
| WO | WO 90/09677 | 8/1990 |
| WO | WO 97/39484 | 10/1997 |
| WO | WO 00/51177 | 8/2000 |

OTHER PUBLICATIONS

Takeshima, N. et al.: "Electrostatic Parallelogram Actuators", IEEE, 1991, pp. 63–66.
Mulhern, G. T. et al.: "Supercritical Carbon Dioxide Drying of Microstructures", Technical Digest of Transducers, 1993, pp. 296–298.
Shieh, B. et al.: "Air Gaps Lower k Of Interconnected Dielectrics", Solid State Technology, Feb. 1999, pp. 51–58.
M.B. Anand et al.: "NURA: A Feasible, Gas–Dielectric Interconnect Process", *1996 Symposium on VLSI Technology Digest of Technical papers*, 1996, pp. 82–83.
J.G. Fleming et al.: "Use Of Air Gap Structures To Lower Intralevel Capacitance", *Proceedings of 1997 DUMIC Conference*, Feb. 10–11, 1997, pp. 139–145.
B. Shieh et al.: "Air–Gap Formation During IMD Deposition to Lower Interconnect Capacitance", *IEEE Electron Device Letters*, vol. 19, No. 1, Jan. 1998, pp. 16–18.

(List continued on next page.)

*Primary Examiner*—George Fourson
*Assistant Examiner*—Michelle Estrada
(74) *Attorney, Agent, or Firm*—Laurence A. Greenberg; Werner H. Stemer; Ralph E. Locher

(57) ABSTRACT

A method for producing cavities, which are patterned in submicrometer dimensions, in a cavity layer of a semiconductor device, is described. In the method, a process liquid is frozen in the trenches in a process layer which has been patterned by ribs and trenches, then the process liquid is covered with a covering layer and is then expelled from the cavities resulting from the covering of the trenches.

17 Claims, 1 Drawing Sheet

OTHER PUBLICATIONS

Tetsuya Ueda et al.: "A Novel Air Gap Intergration Scheme for Multi–level Interconnects using Self–aligned Via Plugs", *1998 Symposium on VLSI Technology Digest of Technical Papers,* 1998, pp. 46–47.

Jung–Kyun Hong et al.: "The effect of sol viscosity on the sol–gel derived low density $SiO_2$ xerogel film for intermetal dielectric application", *Thin Solid Films*, No. 332, 1998, pp. 449–454.

Ben Shieh et al.: "Air gaps lower k of interconnect dielectrics", *Solid State Technology*, Feb. 1999, pp. 51–58.

* cited by examiner

METHOD FOR PRODUCING CAVITIES WITH SUBMICROMETER PATTERNS IN A SEMICONDUCTOR DEVICE USING A FREEZING PROCESS LIQUID

BACKGROUND OF THE INVENTION

Field of the Invention

The invention relates to a method for producing cavities (air gaps), which are patterned in submicrometer dimensions, in an cavity layer of a semiconductor device using a freezing process liquid, and to a configuration which is fabricated by the method and has cavities, which have been patterned in submicrometer dimensions, in a semiconductor device.

Within a semiconductor device, interconnects are capacitively coupled to one another both within an interconnect layer (intralevel) and between different interconnect layers (interlevel). Capacitive coupling between interconnects of this nature leads to crosstalk and lengthened signal propagation times.

To minimize the disruptive effects, the interconnects are decoupled from one another as best they can be by keeping the capacitance between them at as low a level as possible. For a given spacing between two interconnects, this requires the material between the interconnects to have the lowest possible permittivity. Gaseous substances, i.e. air, have a virtually optimal permittivity of almost 1 at standard pressure, while the permittivity of solids is generally much higher.

Therefore, it is generally attempted in semiconductor devices to capacitively decouple the interconnects from one another by use of air-filled cavities. The text that follows will describe the known methods for producing cavities of this type. All the methods are based on a process layer that has already been patterned by ribs and trenches.

In functional terms, the ribs of the process layer may be interconnects. The trenches in the process layer are as yet uncovered cavities. Accordingly, an interconnect layer is one possible (but not the only) embodiment of a cavity layer which results from the process layer.

According to a first method, the trenches are filled with porous materials, such as xerogels or aerogels, and are then covered with a covering layer made from a dielectric. The air which is enclosed in the pores reduces the overall permittivity of the material between the interconnects. Porous materials of this type are currently in the evaluation phase. Drawbacks of the method are the water uptake on account of the capillary effect in open-pored structures, and the relatively long process times. Furthermore, filling the cavities with xerogel and aerogel material increases the permittivity of the air gaps compared to a pure air filling. The use of aerogels as dielectrics with a low permittivity is described, for example, in the reference titled "The Effect Of Sol Viscosity On The Sol-Gel Derived Low-Density $SiO_2$ Xerogel Film For Intermetal Dielectric Application", Thin Solid Films, vol. 332, p. 449–454, 1998.

A second method is for trenches to be covered by conventional $SiO_2$ chemical vapor deposition (CVD) processes with a high deposition rate.

A first variant of a method of this type is described in the reference by B. P. Shieh, et al., titled "Air-Gap Formation During IMD Deposition to Lower Interconnect Capacitance", IEEE Electron Device Letters, Vol. 19, No. 1, pp. 16–18, January 1998. However, cavities produced in this way extend into the covering $SiO_2$ layer (formation of small hats). During subsequent chemical mechanical polishing (CMP) processes, the cavities below can be opened up, and adjacent interconnects can be short-circuited by subsequent metallization in the opened cavities. If the $SiO_2$ layer is deposited in a size that is such that it rules out subsequent opening of the cavities, the problem is then of making contact with interconnects below it through sufficiently deep vias.

In a variant of this method, described in the reference by T. Ueda, et al., titled "A Novel Air Gap Integration Scheme for Multi-level Interconnects using Self Aligned Via Plugs", Symp. on VLSI Technology, pp. 46, 47, June 1998, the trenches are covered using a two-stage process. In a first stage, $SiO_2$ is deposited on the horizontal surfaces of the ribs using a plasma enhanced chemical vapor deposition (PECVD) process. Narrow trenches are covered by the $SiO_2$ that grows on the surfaces of the ribs on both sides of the trenches. In a subsequent high-density plasma CVD process, wider trenches are filled with $SiO_2$ and narrow trenches are sealed with $SiO_2$.

According to a third method, described in the reference by J. G. Fleming, E. Roherty-Osmum, titled "Use of Air-Gap Structures to Lower Intralevel Capacitace", Proc. DUMIC, pp. 139–145, 1997, spin-on materials are used to cover the cavities between the interconnects. The drawback of the method is the subsequent flow of the materials into the cavities.

A fourth method is described in International Patent Disclosure WO 97/39484 A1 (Rosenmayer, Noddin). In this method, a film is placed onto the interconnect layer, which has been patterned by trenches and ribs. A film of this type is at least a few micrometers thick, so that it can be reliably processed. Therefore, as above, there are considerable distances between the interconnect levels, with the drawbacks described of making contact using vias.

A fifth method, which is described in U.S. Pat. No. 6,165,890 (Kohl et al.), is the retropolymerization of polynorbornene, which temporarily fills the cavities between the interconnects. In this method, inevitable residues of the retropolymerization may lead to clusters that are critical with regard to short circuits. Furthermore, the choice of a dielectric between the interconnect layers is limited, since the material has to be permeable to the volatile substances which form during the retropolymerization.

Similar drawbacks result from a sixth method, the thermal decomposition of a temporary filling of the cavities between the interconnects. An example of thermal decomposition of a temporary filling with a photoresist is described in U.S. Pat. No. 5,668,398 (Havemann et al.). The oxidation of a temporary carbon layer forms the subject of a reference by M. B. Anand, M. Yamada, H. Shibata, titled "NURA: A Feasible, Gas Dielectric Interconnect Process", Symp. on VLSI Technology, pp. 82, 83, June 1996. In both cases, the substances formed during the decomposition have to be forced through the covering layer, which restricts the choice of materials. The residues in the cavities that cannot be decomposed increase the permittivity and/or reduce the protection against short circuits. According to a further example, which is known from International Patent Disclosure WO 00/51177 (Werner, Pellerin), for the decomposition of a temporary filling, the covering layer is perforated before the decomposition of the filling, in order to accelerate or improve the expulsion of the decomposition residues.

According to a seventh method, which is known from U.S. Pat. No. 5,599,745 (Reinberg), a dielectric is applied to the ribs formed by the interconnects, is partially melted until this layer bulges out over the interconnect. The bulges in the covering layer of closely adjacent interconnects ultimately come into contact with one another, so that the trenches between them are spanned.

A description which summarizes known methods for producing cavities in a semiconductor substrate is described, together with an assessment of the results which can be achieved by these methods, in the article by Ben Shieh, Krishna Saraswat, Mike Deal, Jim McVittie, titled "Cavities Lower k Of Interconnect Dielectrics" Solid State Technology, February 1999.

To summarize, the drawbacks of the methods which have been described are:

a) residues in the cavities, which increase the permittivity and/or reduce the protection against short circuits;

b) the thickness required of the layer which covers the trenches, and the difficulty of producing vias which such a thickness implies; and c) process integration.

Furthermore, freezing sublimation techniques are known from the fabrication of open trench structures in semiconductor components that have microstructures. In these techniques, after a purging operation semiconductor devices are dried by the purge liquid that is still on the semiconductor device initially being frozen and then sublimed in the frozen state. This method prevents deformation and/or sticking of predominantly unsupported microstructures.

A t-butylalcohol freezing-sublimation method is described in the reference by Takeshima, N., et al., titled "Electrostatic Parallelogram Actuators", in: 1991 International Conference on Solid-State Sensors and Actuators: Transducers 91, San Francisco, Calif., USA, 1991, pp. 63–66.

A critical transition from a liquid phase to a gas phase is avoided in the reference by Gregory T. Mulhern et al., titled "Supercritical Carbon Dioxide Drying of Microstructures" in: Technical Digest of Transducers 93, 1993, pp. 296–298 as a result of the purge liquid being replaced by liquid carbon dioxide which is subsequently converted into a supercritical phase.

A further freezing-sublimation technique is described in International Patent Disclosure WO 90/09677 (Guckel, Sniegowski). The sublimation of the purge liquid from the solid phase prevents any deviation in any micromechanical structures on a semiconductor device during the drying operation.

SUMMARY OF THE INVENTION

It is accordingly an object of the invention to provide a method for producing cavities with submicrometer patterns in a semiconductor device by use of a freezing process liquid that overcomes the above-mentioned disadvantages of the prior art methods and devices of this general type, which allows patterned cavities of submicrometer dimensions to be created in a cavity layer of a semiconductor device using methods and tools which are customary in semiconductor process engineering. The cavities are to be free of residues.

With the foregoing and other objects in view there is provided, in accordance with the invention, a method for producing patterned cavities having submicrometer dimensions in a cavity layer of a semiconductor device. The method includes providing a base layer, and applying a process layer to the base layer. The process layer initially is a compact, homogeneous process layer. The process layer is patterned for forming ribs having submicrometer dimensions and trenches between the ribs, the ribs being formed from layer material. The trenches are filled with a process liquid and the process liquid is then cooled to a temperature below its freezing point resulting in a frozen process liquid. A resulting process surface has sections formed from uncovered surfaces of the ribs and from a surface of the frozen process liquid. A covering layer is applied to the process surface resulting in the formation of cavities in areas where the covering layer covers the trenches. Finally, the process liquid is expelled from the cavities, thus completing a formation of the cavity layer from the process layer.

In the method according to the invention, therefore, the initially compact process layer is applied to the base layer and then patterned. In the process, ribs of submicrometer dimensions and trenches between the ribs are formed from the material of the process layer. The trenches are filled with a process liquid, and then the process liquid is cooled to a temperature below its freezing point. Then, a first covering layer is applied to a process surface that is composed of the surfaces of the process liquid that has been frozen in the trenches and the ribs. A cavity or air-gap layer is formed from the process layer as a result of the process liquid being expelled from the cavities formed by covering the trenches.

With a dielectric as the material used for the ribs, an cavity layer of this type can be used as an interlayer of low permittivity between two interconnect layers.

Preferably, however, the ribs are formed from a conductive material and in functional terms are interconnects. In this case, the cavity layer functions as an interconnect layer (also referred to below as a metallization level). The metallization level is applied using a conventional technique according to one of the two following processes.

According to a first process, an auxiliary layer, which is formed of an auxiliary material, is deposited on the base layer. A photoresist is applied to the auxiliary layer and is patterned by a lithographic process. In the process, the auxiliary layer is uncovered in sections. The uncovered sections of the auxiliary layer are removed, leading to the formation of auxiliary trenches in the auxiliary layer. Then, a layer of a conductive material is applied over the entire surface, the auxiliary trenches being filled with the conductive material. Then, the conductive material is ground away again until the original surface of the auxiliary layer is reached. The auxiliary material is etched out of a process layer that has been formed in this way and has been patterned by the conductive material and the auxiliary material, using an etching medium, so that only ribs of the conductive material remain. This technique is also known as the Damascene technique.

According to a second method, a compact, homogeneous layer of the conductive material forms the process layer. A lithographic process is used to pattern a photoresist on the process layer. The process layer is etched according to the pattern of the photoresist. Ribs containing the conductive material of submicrometer dimensions and trenches that lie between the ribs are formed.

The base layer is preferably formed as an etching stop layer, in order to allow or simplify the patterning of the process layer.

If the cavity layer which has been developed from the process layer is to be formed as an interconnect layer, the material used for the ribs of the process layer is a conductive material, preferably copper.

If the purpose of the cavity layer is capacitive decoupling of two interconnect layers, the material used for the ribs is preferably a dielectric of low permittivity.

The trenches in the process layer preferably extend as far as the base layer, in order to achieve the highest possible overall permittivity between adjacent ribs.

For the same reason, the trenches are also ideally filled with the process liquid all the way up to the top edge of the ribs.

Suitable process liquids are in particular liquids which can condense on the surface of the process layer at approximately standard pressure (i.e. $1.013*10^5$) and temperature and the freezing points of which, at standard pressure, are close to standard temperature (i.e. 25° C.), and which, furthermore, can easily be forced through a first covering layer which is subsequently applied.

It is particularly preferable for 1,3-propanediol to be used as process liquid.

Further suitable liquids are alcohols, such as cyclohexanol, and also acetophenone and water.

Partial etching of the surfaces of the ribs improves the adhesion of the first covering layer that has been applied to the surfaces. The partial etching preferably takes place in a hydrogen plasma.

In a preferred variant of the method according to the invention, the first covering layer contains a layer of amorphous hydrocarbon with a submicrometer thickness and is deposited using a CVD process. The deposition operation is stopped as soon as the deposited layer is thick enough to span the trenches without support.

The CVD process is preferably a PECVD process using the process gases ethene and thiophene.

The process liquid is forced through the first covering layer by being heated. Polymerization of the first covering layer and expulsion of the process liquid may preferably take place in the same process step, for example by slow heating to approximately 200° C.

As the process continues, a second covering layer made from a dielectric of low permittivity can be applied to the first covering layer, which is typically only 60 nanometers thick. The dielectric is preferably an organic dielectric, for example polybenzoxazole or an a-C:F(H) film. In the text which follows, contact holes can be etched into the double layer containing the first covering layer of amorphous hydrocarbon and the second covering layer containing an organic dielectric in a similar way within one process step.

However, silicon dioxide is also suitable as a material for a second covering layer.

The method according to the invention produces a semiconductor device that, in the cavity layer, has virtually ideal cavities. The low permittivity of the cavities optimally decouples interconnects which are separated by the cavities.

Therefore, the invention also relates to a configuration in a semiconductor device, containing a base layer, a cavity layer that is positioned on the base layer and has a pattern of submicrometer dimensions. The cavity layer contains ribs made from a layer material and cavities. A first covering layer formed of a polymer, rests on the ribs and covers the cavities.

The first covering layer preferably has a thickness of less than 100 nanometers.

The base layer is preferably an etching stop layer, and formed of silicon nitride.

In a preferred variant of the configuration according to the invention, the ribs formed of a layer material contain a conductive material and, particularly preferably, of copper.

A second covering layer, which rests on the first covering layer containing the polymer, may be added to the configuration.

The second covering layer preferably is formed of an organic dielectric.

Other features which are considered as characteristic for the invention are set forth in the appended claims.

Although the invention is illustrated and described herein as embodied in a method for producing cavities with submicrometer patterns in a semiconductor device by use of a freezing process liquid, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
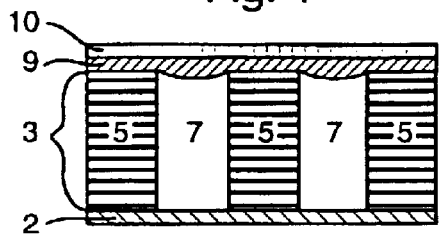
FIG. 1 is a diagrammatic, cross-sectional view through part of a configuration according to the invention.

Referring now to the figures of the drawing in detail and first, particularly, to FIG. 1 thereof, there is shown an excerpt of an exemplary embodiment having a structure of an cavity layer 3 containing three ribs 5 of a conductive material which run parallel to one another and two cavities 7 between them. The cavities 7 are closed off at the bottom by a base layer 2 and at the top by a first covering layer 9. In the present exemplary embodiment, a second covering layer 10 formed of an organic dielectric is located on top of the first covering layer 9. The ribs 5 and the cavities 7 have submicrometer dimensions. The thickness of the first covering layer is approximately 40–100 nm.

FIGS. 2A–2G show the individual method steps that are involved in the fabrication of the cavity layer 3 according to the invention.

Figure 2A:
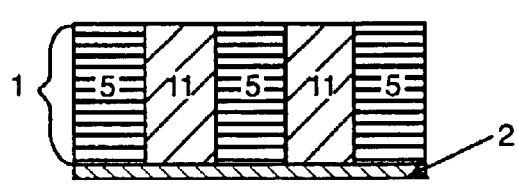
FIGS. 2A–2G are sectional views depicting method steps involved in the method according to the invention.

FIG. 2A shows the state of a compact process layer 1 which is located on the base layer 2 after auxiliary trenches have been etched into an auxiliary layer containing an auxiliary material, for example silicon dioxide, using a conventional technique, then a conductive material has been applied over a large surface area and has then been removed again down to the top edge of the auxiliary layer, so that the ribs 5 of the conductive material have formed in the auxiliary trenches between auxiliary ribs 11.

Figure 2B:
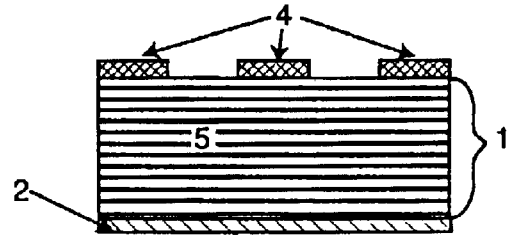
Figure 2C:
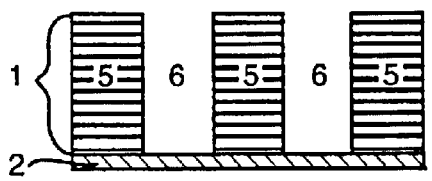

The patterning of the process layer 1 of this first type, i.e. the transition from the state shown in FIG. 2A to the state shown in FIG. 2C, takes place by etching out the auxiliary material.

FIG. 2B shows the process layer 1 which has been applied to the base layer 2 in accordance with a second embodiment as a homogeneous layer of the conductive material. In this case, the patterning is carried out with the aid of a photoresist layer 4 which has been applied to the process layer 1 and patterned using a lithographic process.

The transition from the state shown in FIG. 2B to the state shown in FIG. 2C takes place using conventional technology by removing the conductive material in accordance with the pattern of the photoresist layer 4 resting on it and then completely removing the photoresist layer 4.

FIG. 2C shows the base layer 2 and the process layer 1 which is located thereon and has been patterned into trenches 6 and the ribs 5 of submicrometer dimensions.

A process liquid 8 is condensed onto the configuration shown in FIG. 2C. The duration of the process step is such that the process liquid 8 does not quite exceed the height of the ribs 5. Then, the configuration is cooled to below the freezing point of the process liquid 8.

Figure 2D:
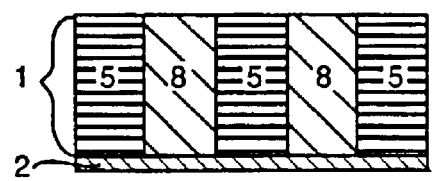

FIG. 2D shows the configuration after the process liquid has frozen. The uncovered surfaces of the ribs 5 and of the frozen process liquid 8 form an approximately planar process surface.

In the next method step, the first covering layer 9 is deposited on the process surface. The deposition process is interrupted at the earliest when the first covering layer 9 is thick enough to freely span the trenches 6.

Figure 2E:
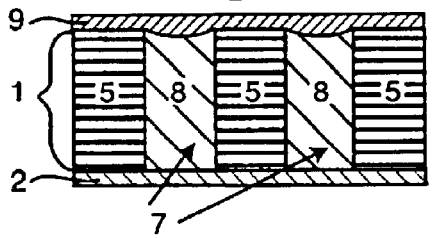

The result is a configuration as shown in FIG. 2E. The first covering layer 9 rests on the surfaces of the ribs 5 and of the frozen process liquid 8.

The process liquid 8 that has been covered by the first covering layer 9 is pumped through the first covering layer 9 by heating, so that the cavities 7 are obtained.

Figure 2F:
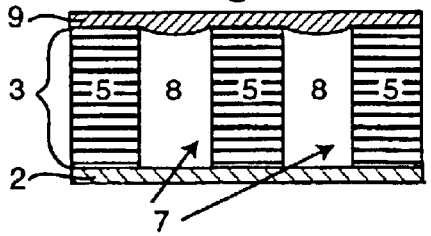

This state is illustrated in FIG. 2F. The cavities 7 are formed as a result of the process liquid 8 being covered and then pumped out. The cavity layer 3 has been produced from the process layer 1.

Figure 2G:
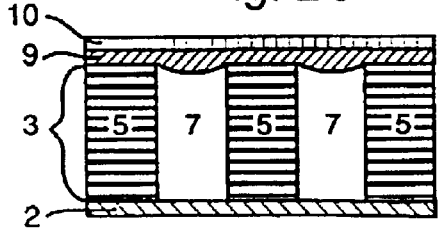

Finally, as shown in FIG. 2G, the second covering layer 10 is applied. To do this, it is preferable to deposit an organic dielectric of low permittivity on the first covering layer 9.

EXAMPLE

First, a silicon nitride layer is deposited on a silicon wafer, to act as an etching stop layer, and an auxiliary layer of $SiO_2$ is deposited on the silicon nitride layer. A layer of a photoresist is applied to the auxiliary layer of $SiO_2$, and the photoresist layer is patterned by electron beam lithography.

The pattern of the photoresist layer is etched into the auxiliary layer of $SiO_2$ using a targeted $CF_4$ RIE plasma, so that auxiliary ribs of $SiO_2$, which are 100 nm wide and 200 nm deep, and auxiliary trenches are obtained, the auxiliary trenches extending as far as the silicon nitride layer.

Copper is sputtered over the entire surface of the $SiO_2$ layer which has been patterned in this way, and the copper which projects above the auxiliary trenches is ground away again by chemical mechanical polishing (CMP), so that then only the auxiliary trenches are filled with copper.

The auxiliary ribs of $SiO_2$ are etched out using a buffered HF solution, so that ribs of copper remain on the silicon nitride layer.

At standard pressure and temperature, 1,3-propanediol is condensed as the process liquid onto the surface of the wafer in a PECVD installation with a parallel configuration of plates and a surface ratio of 1:1. The duration of the operation is such that a film of 1,3-propanediol that forms does not quite exceed the height of the ribs.

Then, the wafer is cooled to −40 degrees Celsius, so that the 1,3-propanediol solidifies, hydrogen is introduced into the reactor volume and the volume is then rapidly evacuated to a pressure of 0.1 mbar.

Then, the pressure is set to 0.8 mbar and, at a flow rate of 100 sccm of hydrogen, an RF plasma which is pulsed at 100 Hz with a switched-on ratio of 20% is ignited with a power of 100 W for 15 s, the surfaces of the ribs being cleaned.

Then, at a flow rate of 100 sccm of ethene and 5 sccm of thiophene, an RF plasma which is pulsed at 100 Hz with a switched-on ratio of 20% is ignited with a power of 100 W for 30 seconds, with the result that an approximately 60 nm thick layer of amorphous hydrocarbon (a-C-:H) is deposited as the first covering layer.

Then, the wafer is heated in a vacuum over the course of two hours to 200 degrees Celsius, with a holding time of 2 minutes, in order for the 1,3-propanediol which has been enclosed as a result of the covering of the trenches to be pumped out through the polymer-like a-C:H layer.

An inspection under a scanning electron microscope shows that cavities which are covered at the top by the a-C:H layer and no longer contain any process residues have been formed from the trenches.

We claim:

1. A method for producing patterned cavities having submicrometer dimensions in a cavity layer of a semiconductor device, comprising the steps of:

providing a base layer;

applying a process layer to the base layer, the process layer initially being a compact, homogeneous process layer;

patterning the process layer for forming ribs having submicrometer dimensions and trenches between the ribs, the ribs being formed of a layer material;

filling the trenches with a process liquid;

cooling the process liquid to a temperature below its freezing point resulting in a frozen process liquid, and in a process surface having sections formed from uncovered surfaces of the ribs and from a surface of the frozen process liquid;

applying a covering layer to the process surface resulting in the formation of cavities in areas where the covering layer covers the trenches; and expelling the process liquid from the cavities, thus completing the formation of the cavity layer from the process layer.

2. The method according to claim 1, which comprises:

applying an auxiliary material for forming the process layer; and performing the patterning of the process layer step by the steps of:

removing the auxiliary material from sections of the process layer provided for the ribs resulting in a formation of auxiliary trenches and auxiliary ribs;

introducing the layer material into the auxiliary trenches; and removing the auxiliary ribs.

3. The method according to claim 1, which comprises:

applying the layer material for forming the process layer; and performing the patterning of the process layer step by the steps of:

applying a photoresist layer to the process layer;

patterning the photoresist layer in a photolithographic process, the process layer being uncovered in sections resulting in uncovered sections; and removing the layer material from the uncovered sections of the process layer.

4. The method according to claim 1, which comprises forming the base layer as an etching stop layer.

5. The method according to claim 1, which comprises using a conductive material as the process layer material.

6. The method according to claim 1, which comprises forming the trenches of the process layer down to the base layer.

7. The method according to claim 1, which comprises filling the trenches in the process layer with the process liquid up to a top edge of the ribs.

8. The method according to claim 1, which comprises selecting the process liquid to have, at standard pressure p - 1.013 * $10^5$ Pa, a condensation point and a freezing point in a region of a standard temperature T=250° C. and in a gaseous state readily passes through the covering layer.

9. The method according to claim 8, which comprises selecting the process liquid from the group consisting of 1,3-propanediol, cyclohexanol, acetophenone and water.

10. The method according to claim 1, which comprises partially etching the uncovered surfaces of the ribs before the covering layer is applied.

11. The method according to claim 10, which comprises performing the etching in a hydrogen plasma.

12. The method according to claim 1, which comprises applying a layer of amorphous hydrocarbon with a submicrometer thickness to the covering layer.

13. The method according to claim 12, which comprises polymerizing the amorphous hydrocarbon layer.

14. The method according to claim 13, which comprises performing the polymerizing step and the expelling of the process liquid step in a same process step.

15. The method according to claim 1, which comprises forcing the process liquid through the covering layer by heating the process liquid.

16. The method according to claim 1, which comprises applying a further covering layer made from a dielectric of low permittivity to the covering layer.

17. The method according to claim 16, which comprises using an organic dielectric as the dielectric of low permittivity.

* * * * *